US010712550B2

(12) United States Patent
Champion et al.

(10) Patent No.: US 10,712,550 B2
(45) Date of Patent: Jul. 14, 2020

(54) COLOCATING SIGNAL PROCESSING DEVICE WITH MICROMECHANICAL SCANNING SILICON MIRROR

(71) Applicant: Microsoft Technology Licensing, LLC, Redmond, WA (US)

(72) Inventors: Mark A. Champion, Kenmore, WA (US); Michael James Nystrom, Mercer Island, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 180 days.

(21) Appl. No.: 15/933,282

(22) Filed: Mar. 22, 2018

(65) Prior Publication Data
US 2019/0293926 A1 Sep. 26, 2019

(51) Int. Cl.
*G02B 26/10* (2006.01)
*G02B 26/08* (2006.01)
*H05K 1/18* (2006.01)

(52) U.S. Cl.
CPC ....... *G02B 26/105* (2013.01); *G02B 26/0833* (2013.01); *G02B 26/101* (2013.01); *H05K 1/181* (2013.01); *H05K 2201/10121* (2013.01); *H05K 2201/10151* (2013.01); *H05K 2201/10287* (2013.01); *H05K 2201/10424* (2013.01); *H05K 2201/10515* (2013.01)

(58) Field of Classification Search
None
See application file for complete search history.

(56) References Cited

U.S. PATENT DOCUMENTS

| 7,659,918 B2* | 2/2010 | Turner ................. B41J 2/471 347/230 |
| 2008/0078262 A1 | 4/2008 | Murata et al. |
| 2010/0177370 A1* | 7/2010 | Sakakibara ........ G02B 26/0858 359/214.1 |
| 2011/0199284 A1 | 8/2011 | Davis et al. |
| 2015/0234177 A1 | 8/2015 | Ishikawa et al. |
| 2015/0241196 A1 | 8/2015 | Gerson |

OTHER PUBLICATIONS

"International Search Report and Written Opinion Issued in PCT Application No. PCT/US19/022160", dated Jun. 7, 2019, 12 Pages.

* cited by examiner

*Primary Examiner* — Jennifer D Carruth
(74) *Attorney, Agent, or Firm* — Medley, Behrens & Lewis, LLC

(57) ABSTRACT

Various technologies described herein pertain to collocating a signal processing device with a micromechanical scanning silicon mirror as part of an apparatus. The micromechanical scanning silicon mirror and the signal processing device are part of separate dies. According to various embodiments, the apparatus can include wire bonds directly between sensor contacts of the micromechanical scanning silicon mirror and the signal processing device; the signal processing device can be mounted on a printed circuit board or mounted on or adjacent to the micromechanical scanning silicon mirror. Pursuant to other embodiments, the signal processing device can be mounted on the micromechanical scanning silicon mirror (e.g., mounted on a foot) and electrically coupled to sensor contacts of the micromechanical scanning silicon mirror (e.g., via wire bonds between the sensor contacts and the signal processing device or connectors that both mechanically and electrically connect the micromechanical scanning silicon mirror and the signal processing device).

20 Claims, 12 Drawing Sheets

COLOCATING SIGNAL PROCESSING DEVICE WITH MICROMECHANICAL SCANNING SILICON MIRROR

BACKGROUND

Scanning display projection systems typically scan a light beam in a raster pattern to project an image made up of pixels that lie on a scan trajectory of the raster pattern. An apparatus that includes a micromechanical scanning silicon mirror can be used as part of a scanning display projection system. For instance, in some conventional two-dimensional raster systems, the micromechanical scanning silicon mirror of the apparatus can sweep a light beam in one dimension (e.g., the micromechanical scanning silicon mirror can be used for horizontal scanning), while a mirror separate from the micromechanical scanning silicon mirror can sweep the beam in another dimension (e.g., the separate mirror can be used for vertical scanning).

Micromechanical scanning silicon mirrors typically include one or more piezoresistive sensors. A piezoresistive sensor of a micromechanical scanning silicon mirror can provide feedback for driving the micromechanical scanning silicon mirror and timing the scanning display projection system. A signal provided by the piezoresistive sensor can be relatively low level. Moreover, the signal from the piezoresistive sensor is often transmitted back to a drive circuit for processing (e.g., the drive circuit can amplify the signal, convert the signal to a digital signal, etc.). However, conventional signal paths between piezoresistive sensor(s) of a micromechanical scanning silicon mirror and a drive circuit commonly include relatively long wire bonds, circuit board traces, connectors, and/or cables. Further, the signal is susceptible to noise along the signal path. Thus, the relatively long length of a conventional signal path between a piezoresistive sensor and a drive circuit can detrimentally impact the signal to noise ratio of the signal being provided from the piezoresistive sensor to the drive circuit.

SUMMARY

Described herein are various technologies that pertain to an apparatus for a scanning display projection system. The apparatus includes a micromechanical scanning silicon mirror and a signal processing device. The micromechanical scanning silicon mirror and the signal processing device are part of separate dies. Moreover, the signal processing device is collocated with the micromechanical scanning silicon mirror. The micromechanical scanning silicon mirror can include a mirror section, a first foot, a second foot, a first flexure, and a second flexure. The first flexure can be between the mirror section and the first foot, with a distal end of the first flexure terminating at the first foot. Moreover, the second flexure can be between the mirror section and the second foot, with a distal end of the second flexure terminating at the second foot. The micromechanical scanning silicon mirror can further include a piezoresistive sensor (or a plurality of piezoresistive sensors) and sensor contacts, where the sensor contacts are electrically coupled to the piezoresistive sensor(s). According to various embodiments, the apparatus can include wire bonds. The wire bonds can be directly between the sensor contacts of the micromechanical scanning silicon mirror and the signal processing device. In accordance with various examples where the apparatus includes wire bonds, the signal processing device can be mounted on the micromechanical scanning silicon mirror (e.g., mounted on the first foot of the micromechanical scanning silicon mirror), mounted on a frame adjacent to the micromechanical scanning silicon mirror (e.g., adjacent to the first foot of the micromechanical scanning silicon mirror), or mounted on a printed circuit board. Thus, a length of a signal path between the piezoresistive sensor and the signal processing device can be shorter than a conventional signal path between a piezoresistive sensor and a drive circuit, which can improve the signal to noise ratio of the signal from the piezoresistive sensor relative to conventional approaches.

Pursuant to various embodiments, an apparatus can include the micromechanical scanning silicon mirror and the signal processing device, which are part of separate dies and collocated with each other. The micromechanical scanning silicon mirror can include the mirror section, the first foot, the second foot, the first flexure, the second flexure, the piezoresistive sensor(s), and the sensor contacts. According to these embodiments, the signal processing device can be mounted on the micromechanical scanning silicon mirror. For instance, the signal processing device can be mounted on the first foot of the micromechanical scanning silicon mirror. Moreover, the signal processing device can be electrically coupled to the sensor contacts of the micromechanical scanning silicon mirror. According to example, wire bonds can electrically couple the signal processing device and the sensor contacts by being directly connected between the sensor contacts of the micromechanical scanning silicon mirror and the signal processing device. Pursuant to another example, the signal processing device can be mounted on the first foot of the micromechanical scanning silicon mirror via connectors, where the connectors both mechanically and electrically connect the micromechanical scanning silicon mirror and the signal processing device. Mounting the signal processing device on the micromechanical scanning silicon mirror can decrease a length of a signal path relative to a conventional signal path between a piezoresistive sensor and a drive circuit, thus leading to improvement in the signal to noise ratio of the signal from the piezoresistive sensor as compared to conventional approaches.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
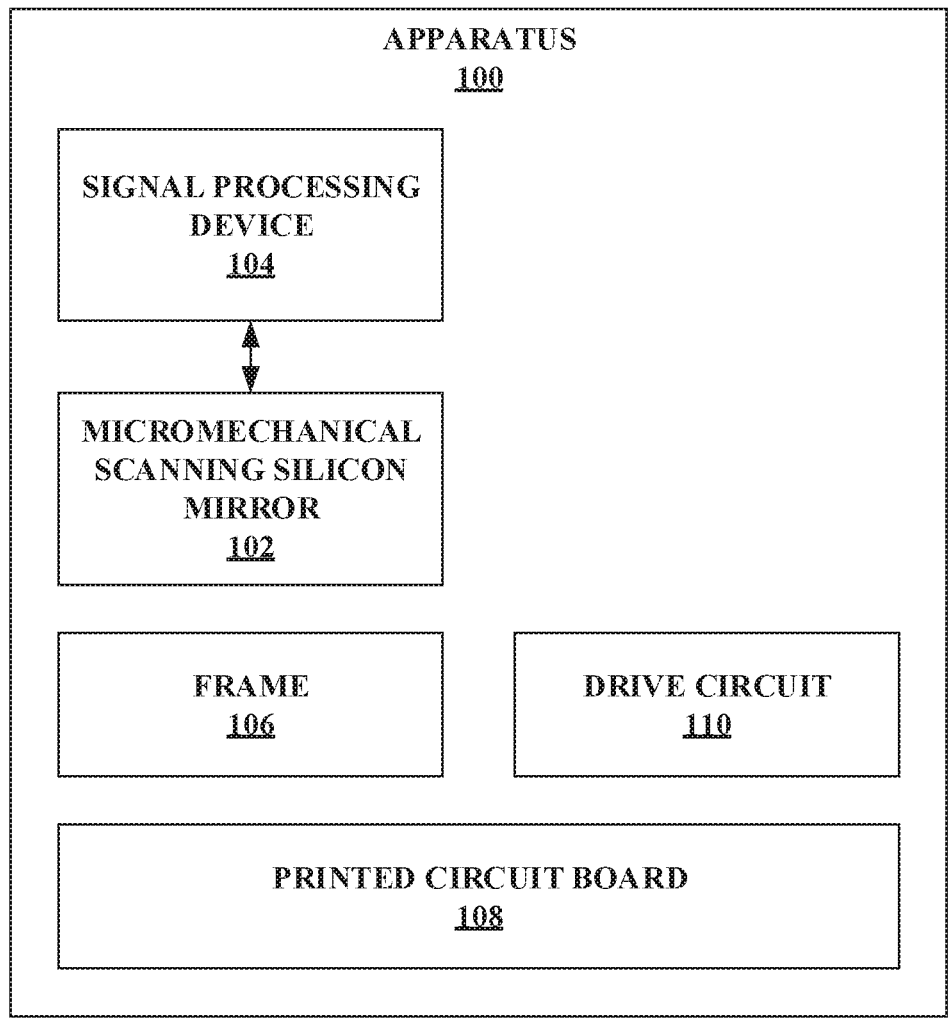
FIG. 1 illustrates a functional block diagram of an exemplary apparatus that can be part of a scanning display projection system.

Various technologies pertaining to collating a signal processing device with a micromechanical scanning silicon mirror as part of an apparatus for a scanning display projection system are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Referring now to the drawings, FIG. 1 illustrates an apparatus 100 that can be part of a scanning display projection system. The apparatus 100 includes a micromechanical scanning silicon mirror 102 and a signal processing device 104. The signal processing device 104 is collocated with the micromechanical scanning silicon mirror 102 in the apparatus 100.

The micromechanical scanning silicon mirror 102 and the signal processing device 104 are part of separate dies. The micromechanical scanning silicon mirror 102 and the signal processing device 104 may be included in separate dies since fabrication processes used to build a micromechanical scanning silicon mirror and a signal processing device can significantly differ. Thus, rather than relying on a more complex fabrication process, two separate fabrication processes tailored specifically for the intended applications can be utilized to separately build the micromechanical scanning silicon mirror 102 and the signal processing device 104.

A direct electrical connection exists between the micromechanical scanning silicon mirror 102 and the signal processing device 104 in the apparatus 100. For instance, wire bonds can be directly between the micromechanical scanning silicon mirror 102 and the signal processing device 104. Additionally or alternatively, the signal processing device 104 can be mounted on the micromechanical scanning silicon mirror 102; in addition to being mounted on the micromechanical scanning silicon mirror 102, the signal processing device 104 can be electrically coupled to the micromechanical scanning silicon mirror 102 (e.g., via wire bonds, via connectors that both mechanically and electrically connect the signal processing device 104 and the micromechanical scanning silicon mirror 102).

The apparatus 100 can further include a frame 106, a printed circuit board 108, and a drive circuit 110. The frame 106 is configured to tilt relative to the printed circuit board 108. Moreover, the micromechanical scanning silicon mirror 102 is mounted on the frame 106; thus, tilting of the frame 106 relative to the printed circuit board 108 can cause tilting of the micromechanical scanning silicon mirror 102. Further, the drive circuit 110 can control the tilt of the frame 106 (e.g., control an actuator to cause the frame 106 to move relative to the printed circuit board 108).

The micromechanical scanning silicon mirror 102 includes a piezoresistive sensor. While many of the examples of the apparatus 100 set forth herein describe a micromechanical scanning silicon mirror that includes one piezoresistive sensor, it is contemplated that these examples can be extended to embodiments where the micromechanical scanning silicon mirror includes more than one piezoresistive sensor (e.g., a biaxial micromechanical scanning silicon mirror that includes two piezoresistive sensors can replace the linear micromechanical scanning silicon mirror described in many of the examples). The piezoresistive sensor, for example, can provide feedback (e.g., transmitted to the drive circuit 110) for driving the micromechanical scanning silicon mirror 102.

A signal outputted by the piezoresistive sensor can be a relatively low level signal to be transmitted back to the drive circuit 110. According to an example, the signal outputted by the piezoresistive sensor can be a differential signal. Following this example, the signal outputted by the piezoresistive sensor can include a reference voltage, ground, and differential outputs (+IN and −IN) (e.g., the reference voltage, ground, and differential outputs can be inputted to the signal processing device 104). However, the claimed subject matter is not so limited.

Conventionally, a signal path for a feedback signal from a piezoresistive sensor to a drive circuit may be relatively long. For instance, a conventional signal path may include long wire bonds (e.g., from a micromechanical scanning silicon mirror to a printed circuit board), circuit board traces, connectors, and cables before signal processing is performed. With such conventional designs, the possibility of noise being added to the signal exists. Moreover, a piezoresistive sensor can have relatively high output impedance.

To address the foregoing, the apparatus 100 includes a direct electrical connection between the signal processing device 104 and the micromechanical scanning silicon mirror 102. The techniques described herein allow for decreasing the length of the signal path, while allowing for the micromechanical scanning silicon mirror 102 to continue to be physically moved and subject to dynamic physical stresses. Thus, a length of a signal path from the piezoresistive sensor to a device that processes the signal outputted by the piezoresistive sensor is decreased, which lowers noise introduced to such signal. Physically locating the signal processing device 104 close to the piezoresistive sensor of the micromechanical scanning silicon mirror 102 can decrease risk of introducing noise into the signal provided by the piezoresistive sensor used for feedback.

Various types of signal processing devices are intended to fall within the scope of hereto appended claims. The signal processing device 104 can be an analog signal processing device, a digital signal processing device, or a combination thereof. For example, the signal processing device 104 can be an amplifier. According to another example, the signal processing device 104 can be a comparator. Pursuant to yet another example, the signal processing device 104 can be a buffer. According to yet another example, the signal processing device 104 can be an analog to digital converter. In accordance with yet a further example, the signal processing device 104 can linearize the signal from the piezoresistive sensor. However, it is contemplated that other types of signal processing devices are intended to fall within the scope of the hereto appended claims.

Figure 2:
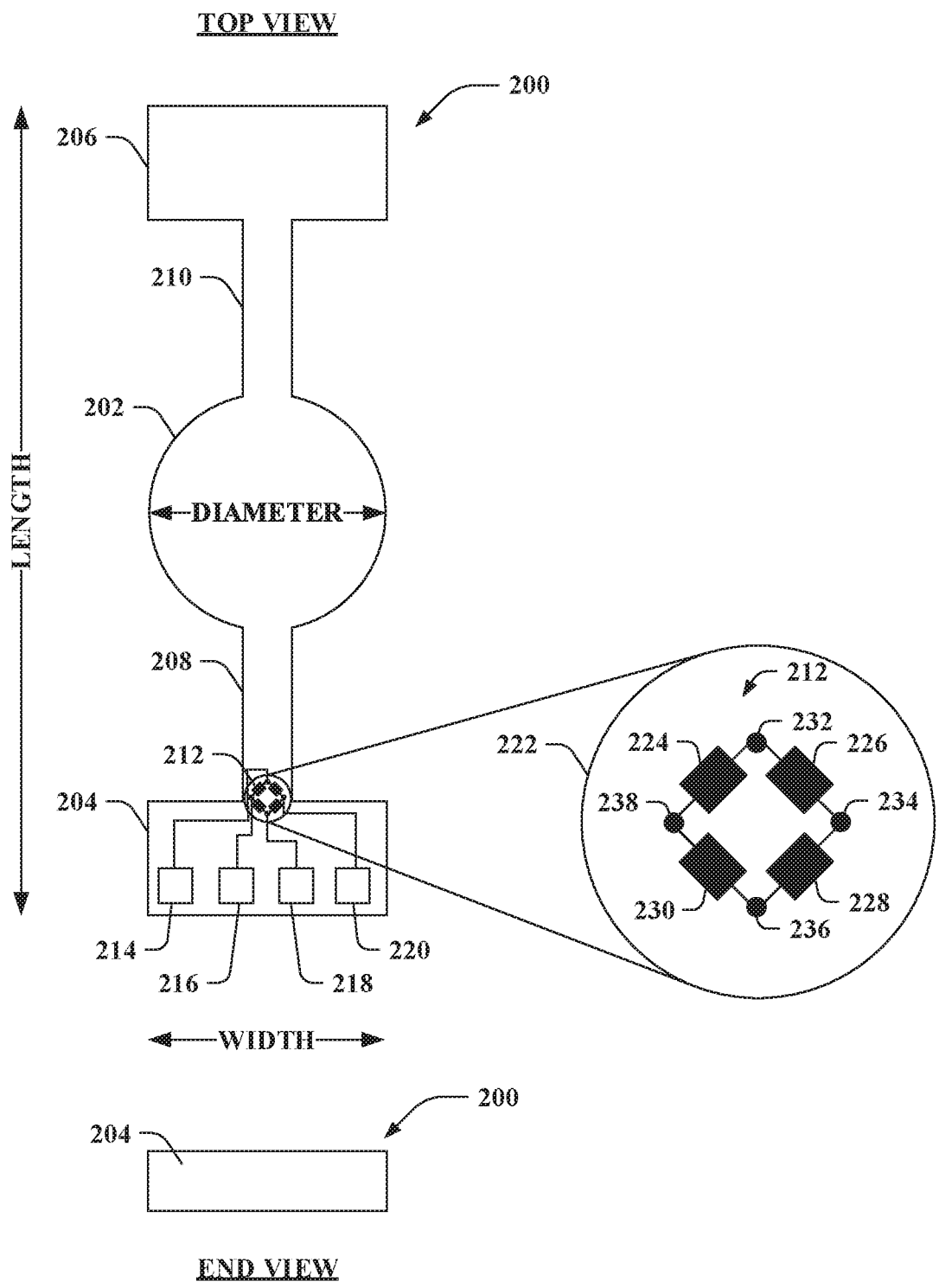
FIG. 2 illustrates an exemplary micromechanical scanning silicon mirror.

Now turning to FIG. 2, illustrated is an exemplary micromechanical scanning silicon mirror 200 (e.g., the micromechanical scanning silicon mirror 102 of FIG. 1). A top view and an end view of the micromechanical scanning silicon mirror 200 are depicted in FIG. 2.

The micromechanical scanning silicon mirror 200 includes a mirror section 202, a first foot 204, a second foot 206, a first flexure 208, and a second flexure 210. The first foot 204 and the second foot 206 are collectively referred to herein as feet 204-206, and the first flexure 208 and the second flexure 210 are collectively referred to herein as flexures 208-210. The first flexure 208 is between the mirror section 202 and the first foot 204. A distal end of the first flexure 208 terminates at the first foot 204. Moreover, the second flexure 210 is between the mirror section 202 and the second foot 206. A distal end of the second flexure 210 terminates at the second foot 206. In the exemplary micromechanical scanning silicon mirror 200 depicted in FIG. 2, a proximal end of the first flexure 208 terminates at the mirror section 202, and a proximal end of the second flexure 210 terminates at the mirror section 202.

The micromechanical scanning silicon mirror 200 further includes a piezoresistive sensor 212 and sensor contacts, namely, a sensor contact 214, a sensor contact 216, a sensor contact 218, and a sensor contact 220 (collectively referred to herein as sensor contacts 214-220). The sensor contacts 214-220 are electrically coupled to the piezoresistive sensor 212. While one piezoresistive sensor 212 and four sensor contacts 214-220 are included in the exemplary micromechanical scanning silicon mirror 200, it is contemplated that other micromechanical scanning silicon mirrors that fall within the scope of the hereto appended claims can include more than one piezoresistive sensor and/or more (or less) than four sensor contacts 214-220.

FIG. 2 also depicts an exploded view 222 of the piezoresistive sensor 212. As shown, the piezoresistive sensor 212 can include four resistors, namely, a resistor 224, a resistor 226, a resistor 228, and a resistor 230 (collectively referred to herein as resistors 224-230). The resistor 224 and the resistor 226 are connected at a node 232, the resistor 226 and the resistor 228 are connected at a node 234, the resistor 228 and the resistor 230 are connected at a node 236, and the resistor 230 and the resistor 224 are connected at a node 238. The sensor contacts 214-220 can respectively be electrically coupled to the nodes 232, 234, 236, and 238.

The first foot 204 of the micromechanical scanning silicon mirror 200 can include the sensor contacts 214-220. Moreover, the piezoresistive sensor 212 can be located at the distal end of the first flexure 208. The piezoresistive sensor 212 being located at the distal end of the first flexure 208 can include the piezoresistive sensor 212 being included in the first flexure 208 near the distal end of the first flexure 208, the piezoresistive sensor 212 being included in the first foot 204 near the first flexure 208, or a portion of the piezoresistive sensor 212 being included in the first flexure 208 near the distal end and another portion of the piezoresistive sensor 212 being included in the first foot 204 near the first flexure 208.

The flexures 208-210 are flexible elements designed to be compliant in specific degrees of freedom. In the example of FIG. 2, the flexures 208-210 of the micromechanical scanning silicon mirror 200 are linearly aligned such that first foot 204 is connected to the first flexure 208, the first flexure 210 is connected to the mirror section 202, the mirror section 202 is connected to the second flexure 210, and the second flexure 210 is connected to the second foot 206. While the flexures 208-210 are depicted as being linear flexures, it is also contemplated that flexures having other shapes can alternatively be included in the micromechanical scanning silicon mirror 200; for example, flexures can be curved or s-shaped to fit the micromechanical scanning silicon mirror 200 in a different aspect ratio shape. The micromechanical scanning silicon mirror 200 is designed such that, when rocked at an appropriate resonance frequency, a tilt angle of the mirror section 202 is larger than a tilt angle of the feet 204-206. A tilt angle can be detected by use of the piezoresistive sensor 212 located at the distal end of the first flexure 208. Thus, the piezoresistive sensor 212 can provide feedback for a drive circuit (e.g., the drive circuit 110) and for a display system.

According to an example, the mirror section 202 can have a diameter of approximately 2 mm; however, it is to be appreciated that other diameters of the mirror section 202 are intended to fall within the scope of the hereto appended claims (e.g., the mirror section 202 can have a diameter of approximately 1 mm, approximately 3 mm, etc.). In accordance with an example, a length of micromechanical scanning silicon mirror 200 can be 14-15 mm. Pursuant to an example, a width of the micromechanical scanning silicon mirror 200 can be 3-4 mm. However, it is to be appreciated that other dimensions of the micromechanical scanning silicon mirror 200 are intended to fall within the scope of the hereto appended claims.

Figure 3:
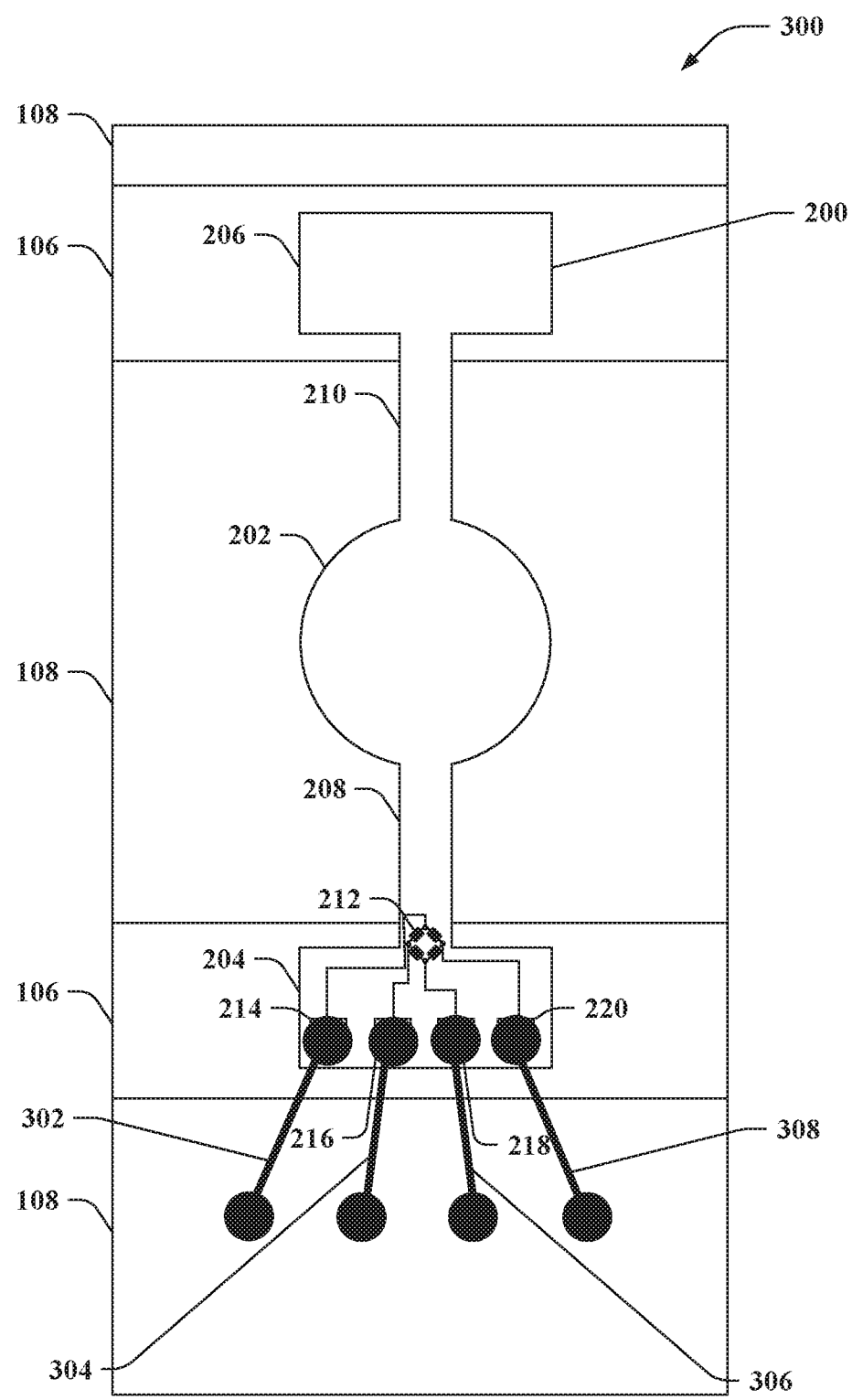
FIG. 3 illustrates a top view of an exemplary apparatus that includes the micromechanical scanning silicon mirror of FIG. 2 without including a signal processing device.

FIG. 3 shows a top view of an exemplary apparatus 300 that includes the micromechanical scanning silicon mirror 200, the frame 106, and the printed circuit board 108. The apparatus 300 shown in FIG. 3 does not include the signal processing device 104. The micromechanical scanning silicon mirror 200 is mounted on the frame 106 (e.g., the feet 204-206 are mounted on the frame 106). The micromechanical scanning silicon mirror 200 can be mounted on the frame 106 via die attach adhesive, solder, or substantially any die stacking technique.

The frame 106 (with the micromechanical scanning silicon mirror 200 mounted thereon) is configured to tilt relative to the printed circuit board 108. It is to be appreciated that the printed circuit board 108 and the frame 106 continue to the left and right (beyond the portions depicted in FIG. 3), where a mechanism (e.g., an actuator) that causes the tilting is located.

The apparatus 300 further includes wire bonds, namely, a wire bond 302, a wire bond 304, a wire bond 306, and a wire bond 308 (collectively referred to herein as wire bonds 302-308). The wire bonds 302-308 are between the sensor contacts 214-220 and the printed circuit board 108. Thus, the wire bonds 302-308 are part of a signal path from the piezoresistive sensor 212. However, as described herein, it can be desired to shorten the signal path to improve the signal to noise ratio of the signal from the piezoresistive sensor 212.

Figure 4:
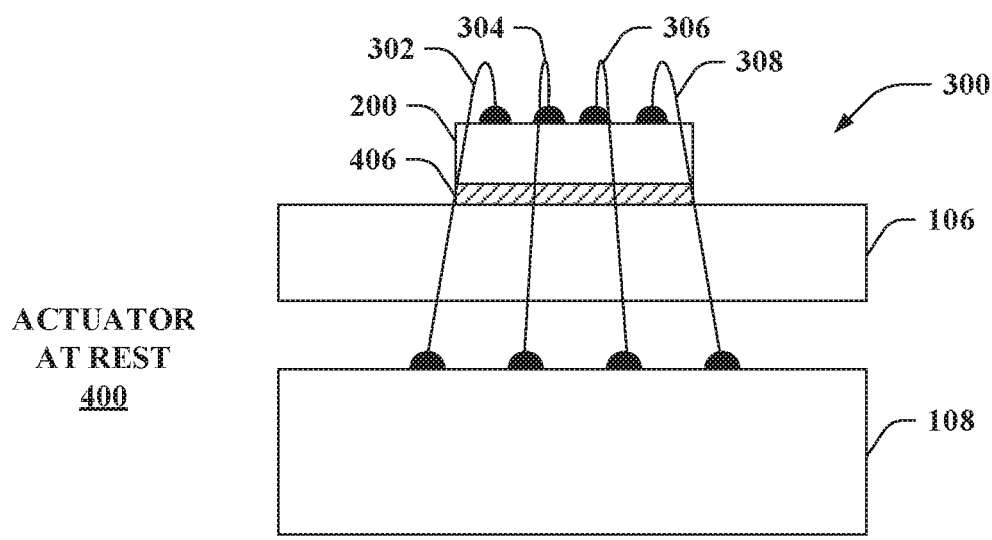
FIG. 4 illustrates end views of the apparatus of FIG. 3.
Figure 4:
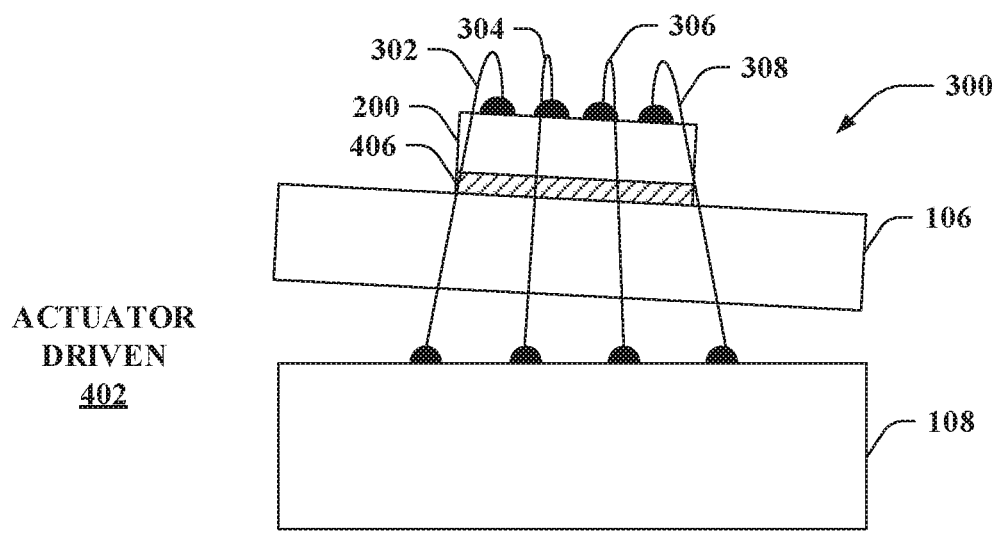
Figure 4:
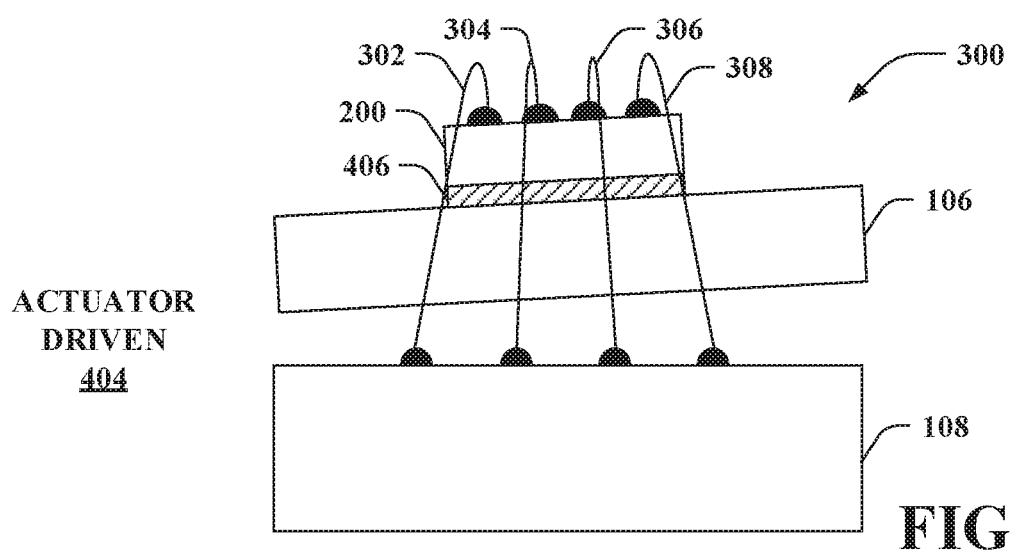

Now turning to FIG. 4, illustrated are end views of the apparatus 300 of FIG. 3. View 400 shows the apparatus 300 with an actuator at rest, and views 402 and 404 show the apparatus 300 at different times when the actuator is driven. Again, the apparatus 300 shown in FIG. 4 does not include the signal processing device 104.

As depicted, the micromechanical scanning silicon mirror 200 is mounted on the frame 106. The micromechanical scanning silicon mirror 200 (e.g., the feet 204-206) and the frame 106 are attached by a layer 406. The layer 406, for example, can be die attach adhesive or solder; however, substantially any die stacking technique can be utilized to mount the micromechanical scanning silicon mirror 200 on the frame 106 via the layer 406. Moreover, the wire bonds 302-308 are between the micromechanical scanning silicon mirror 200 (e.g., the sensor contacts 214-220) and the printed circuit board 108.

When in operation (e.g., when the actuator is driven), as shown in views 402 and 404, the frame 106 can tilt relative to the printed circuit board 108. Tilting of the frame 106 causes tilting of the micromechanical scanning silicon mirror 200 relative to the printed circuit board 108. In the apparatus 300, a signal from the piezoresistive sensor 212 can be carried from the micromechanical scanning silicon mirror 200 to the printed circuit board 108 by way of wire bonds 302-308. The signal path from the piezoresistive sensor 212 can further include circuit board traces included in the printed circuit board 108, connectors, and/or cables. Thus, the relatively long length of the signal path for the apparatus 300 (e.g., between the piezoresistive sensor 212 and a drive circuit) can detrimentally impact the signal to noise ratio of the signal provided from the piezoresistive sensor 212.

Figure 5:
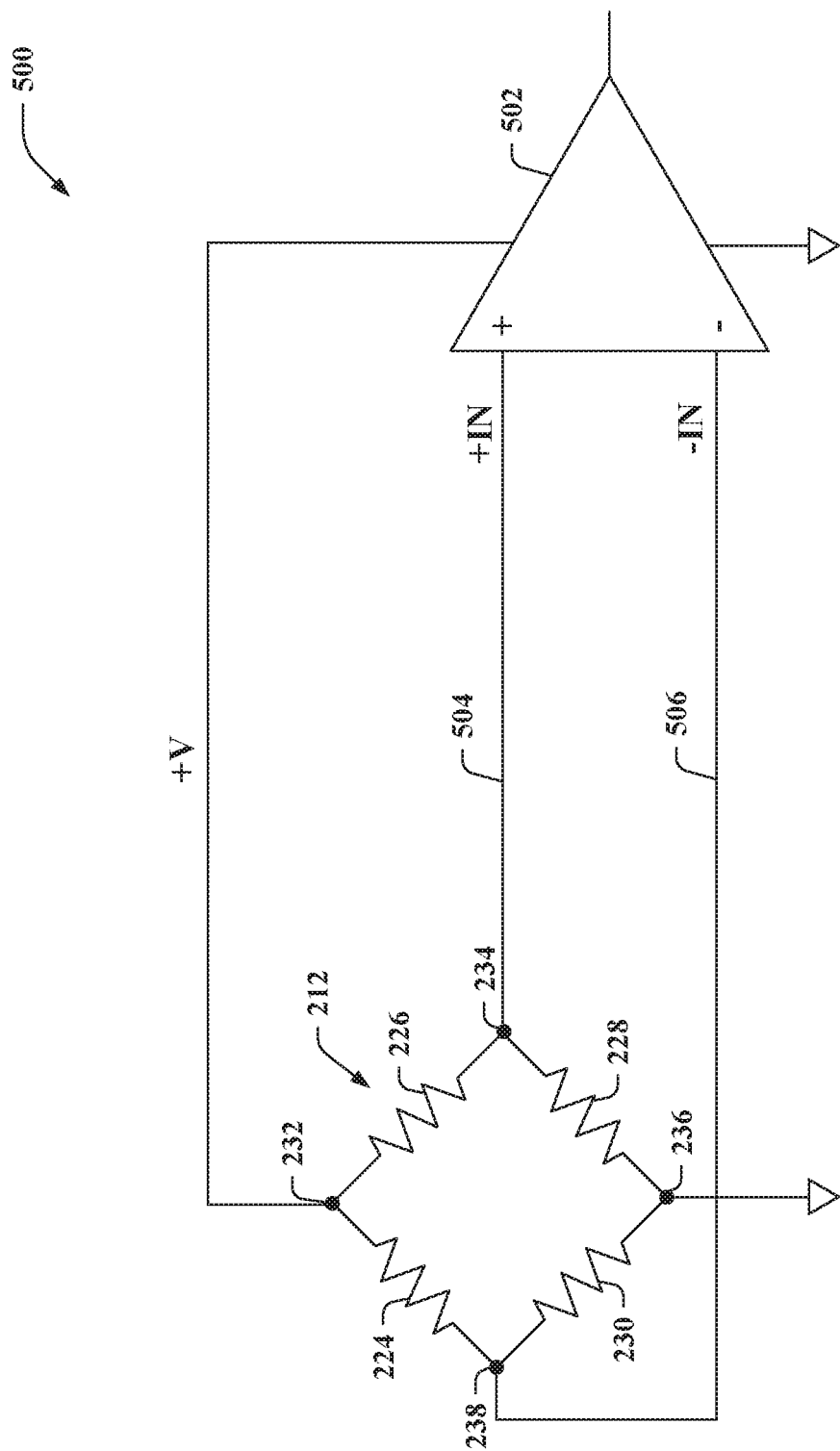
FIG. 5 illustrates an exemplary circuit that includes piezoresistive sensor and an amplifier.

With reference to FIG. 5, illustrated is an exemplary circuit 500 that includes the piezoresistive sensor 212 and an amplifier 502. The piezoresistive sensor 212 has a bridge structure, and includes the resistors 224-230. The resistors 224-230 can have approximately equivalent resistance values.

A reference voltage is applied across the piezoresistive sensor 212. For instance, +V is applied at the node 232, and the node 236 is grounded. Moreover, the piezoresistive sensor 212 performs bridge measurements, with the bridge being connected to inputs of the amplifier 502. Thus, the piezoresistive sensor 212 provides differential inputs (+IN and −IN) to the amplifier 502. The circuit 500 includes paths 504 and 506. The lengths of the paths 504 and 506 are desirably minimized utilizing the techniques described herein to lower noise introduced to the differential inputs along the paths 504 and 506 from the piezoresistive sensor 212 to the amplifier 502. Moreover, it is to be appreciated that the paths 504 and 506 can carry the signal to other types of signal processing devices other than an amplifier in other embodiments.

The amplifier 502 (or other types of signal processing device) can convert a relatively high output impedance interface of the piezoresistive sensor 212 to a lower output impedance interface (e.g., the output impedance of the amplifier 502 can be lower than the output impedance of the piezoresistive sensor 212), which can improve the signal to noise ratio for a signal outputted by the amplifier 502. Moreover, it is contemplated that other types of signal processing devices can perform other processing of the signal from the piezoresistive sensor 212 to likewise lower the output impedance and improve the signal to noise ratio.

Figure 6:
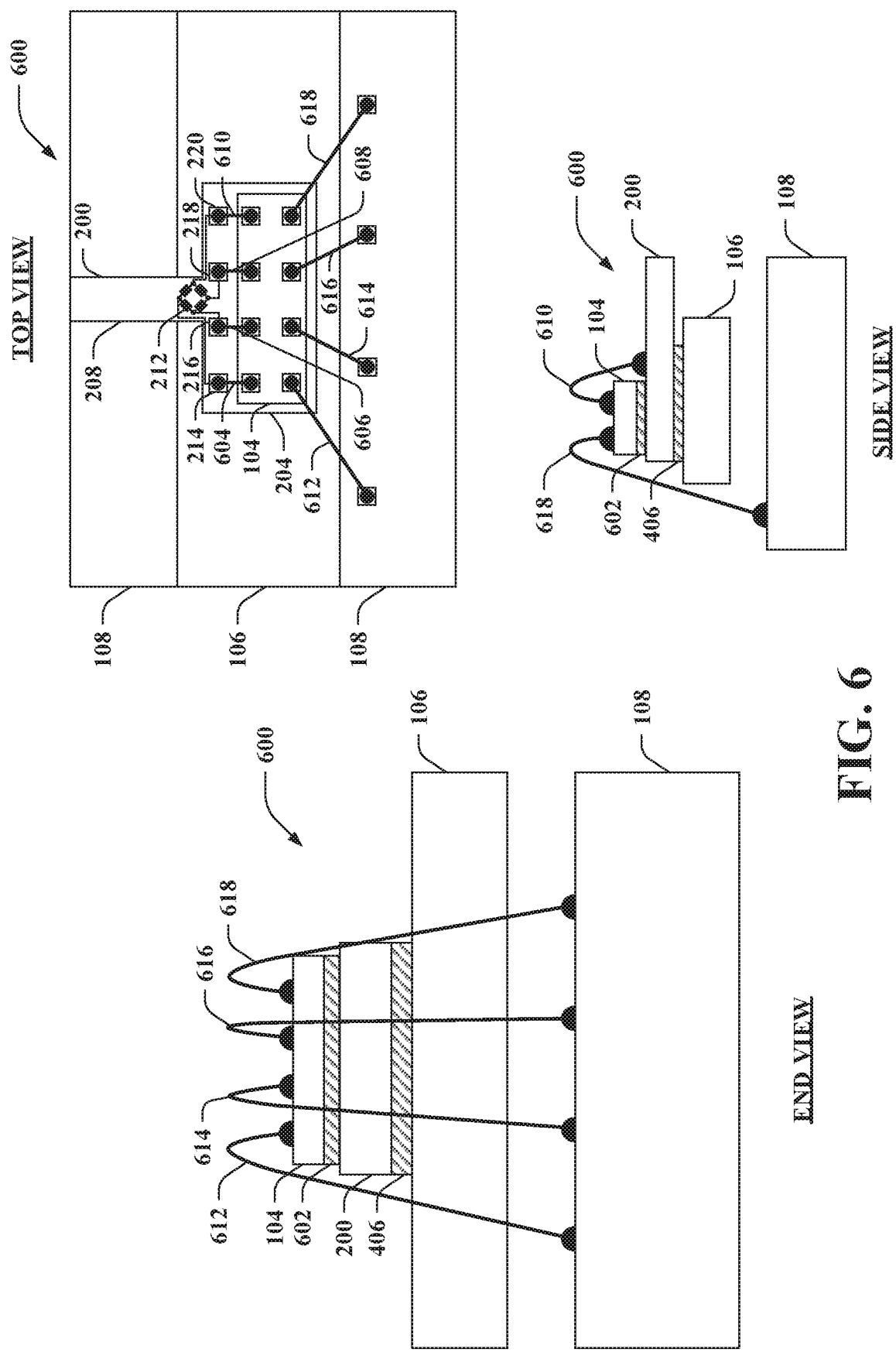
FIGS. 6-9 illustrate various examples of the apparatus of FIG. 1.

With reference to FIG. 6, illustrated is an exemplary apparatus 600 (e.g., the apparatus 100 of FIG. 1) that includes the micromechanical scanning silicon mirror 200, the frame 106, and the printed circuit board 108. FIG. 6 shows a top view, an end view, and a side view of the apparatus 600. It is to be appreciated that the top view and the side view of FIG. 6 only show a portion of the micromechanical scanning silicon mirror 200 (e.g., the second foot 206 can be mounted on the frame 106 as shown in FIG. 3). Similar to above with respect to the apparatus 300, the micromechanical scanning silicon mirror 200 is mounted on the frame 106 (e.g., the feet 204-206 are mounted on the frame 106) in the apparatus 600; the layer 406 attaches the micromechanical scanning silicon mirror 200 to the frame 106.

In contrast to the apparatus 300 which lacks the signal processing device 104, the apparatus 600 includes the signal processing device 104. The signal processing device 104 is collocated with the micromechanical scanning silicon mirror 200 in the apparatus 600.

In the apparatus 600 depicted in FIG. 6, the signal processing device 104 is mounted on the first foot 204 of the micromechanical scanning silicon mirror 200. While depicted as being mounted on the first foot 204 of the micromechanical scanning silicon mirror 200, it is contemplated that the signal processing device 104 can additionally or alternatively be mounted on a different portion of the micromechanical scanning silicon mirror 200 other than the first foot 204 in other embodiments. The signal processing device 104 and the micromechanical scanning silicon mirror 200 (e.g., the first foot 204) can be attached by a layer 602. The layer 602, for example, can be die attach tape or adhesive. Accordingly, the signal processing device 104 can be mounted directly on the first foot 204 of the micromechanical scanning silicon mirror 200 using the die attach tape or adhesive, which can be flexible enough to not transmit strain in the first foot 204 to the signal processing device 104 attached thereto. It is contemplated, however, that substantially any die stacking technique can be utilized to mount the signal processing device 104 on the micromechanical scanning silicon mirror 200, and thus, the claimed subject matter is not limited to use of die attach tape or adhesive.

Moreover, the signal processing device 104 is electrically coupled to the sensor contacts 214-220 of the micromechanical scanning silicon mirror 200. The apparatus 600 includes wire bonds that electrically couple the signal processing device 104 and the sensor contacts 214-220 of the micromechanical scanning silicon mirror 200, namely, a wire bond 604, a wire bond 606, a wire bond 608, and a wire bond 610 (collectively referred to herein as wire bonds 604-610). The wire bonds 604-610 are directly connected between the sensor contacts 214-220 and the signal processing device 104. Moreover, the apparatus 600 includes longer wire bonds that electrically couple the signal processing device 104 to the printed circuit board 108, namely, a wire bond 612, a wire bond 614, a wire bond 616, and a wire bond 618 (collectively referred to herein as wire bonds 612-618). The wire bonds 612-618 between the signal processing device 104 and the printed circuit board 108 can be longer than the wire bonds 604-610 between the micromechanical scanning silicon mirror 200 and the signal processing device 104. The wire bonds 612-618 can be longer to allow for tilting of the frame 106 (as well as the micromechanical scanning silicon mirror 200 and the signal processing device 104) relative to the printed circuit board 108. After signal processing by the signal processing device 104, a feedback signal outputted by the signal processing device 104 can be less susceptible to noise as compared to a signal provided by the piezoresistive sensor 212, and thus, the feedback signal can be carried to the printed circuit board 108 by way of the longer wire bonds 612-618.

Figure 7:
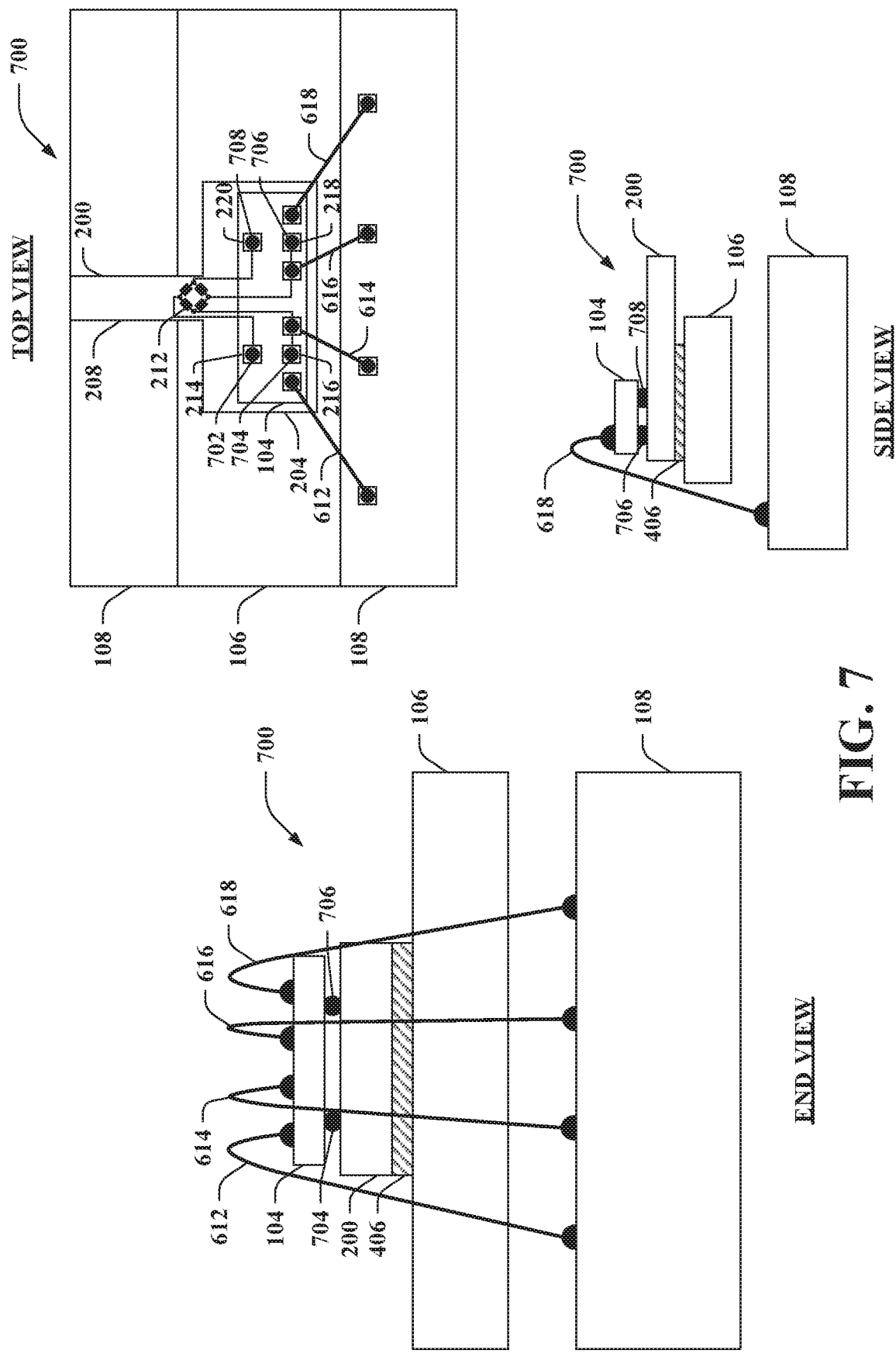

Turning to FIG. 7, illustrated is another exemplary apparatus 700 (e.g., the apparatus 100 of FIG. 1) in which the signal processing device 104 is collocated with the micromechanical scanning silicon mirror 200. A top view, an end view, and a side view of the apparatus 700 are depicted in FIG. 7 (with only a portion of the micromechanical scanning silicon mirror 200 being shown in the top view and the side view). Similar to the apparatus 600, the apparatus 700 includes the signal processing device 104, the micromechanical scanning silicon mirror 200, the frame 106, and the printed circuit board 108. Further, similar to above, the micromechanical scanning silicon mirror 200 is mounted on the frame 106 via the layer 406.

Similar to the apparatus 600, the signal processing device 104 is mounted on the first foot 204 of the micromechanical scanning silicon mirror 200 in the apparatus 700. Moreover, the signal processing device 104 is electrically coupled to the sensor contacts 214-220 of the micromechanical scanning silicon mirror 200. In the apparatus 700 shown in FIG. 7, the signal processing device 104 is mounted on the first foot 204 of the micromechanical scanning silicon mirror 200 via connectors, namely, a connector 702, a connector 704, a connector 706, and a connector 708 (collectively referred to herein as connectors 702-708). The connectors 702-708 both mechanically and electrically connect the micromechanical scanning silicon mirror 200 and the signal processing device 104. According to various examples, the connectors 702-708 can include solder bumps, gold stud bumps, or copper pillars.

The connectors 702-708 can serve as both mechanical and electrical connections between the signal processing device 104 and the micromechanical scanning silicon mirror 200. Although not shown, pursuant to an example, it is contemplated that the signal processing device 104 can be isolated from strain of the first foot 204 of the micromechanical scanning silicon mirror 102 by including a compliant layer between the connectors 702-708 and the signal processing device 104. The foregoing can be accomplished in die and wafer level packaging. However, it is to be appreciated that the claimed subject matter is not limited to the foregoing example.

The apparatus 700 includes the connectors 702-708 rather than the shorter wire bonds 604-610 and the die attached tape or adhesive (e.g., the layer 602), as included in the apparatus 600. Moreover, similar to the apparatus 600, the apparatus 700 includes the longer wire bonds 612-618 between the signal processing device 104 and the printed circuit board 108.

Figure 8:
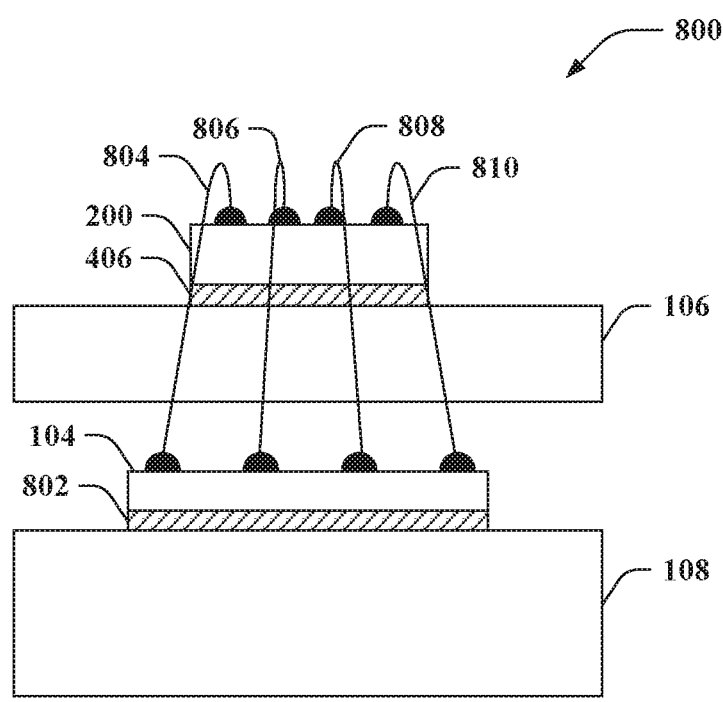
Figure 9:
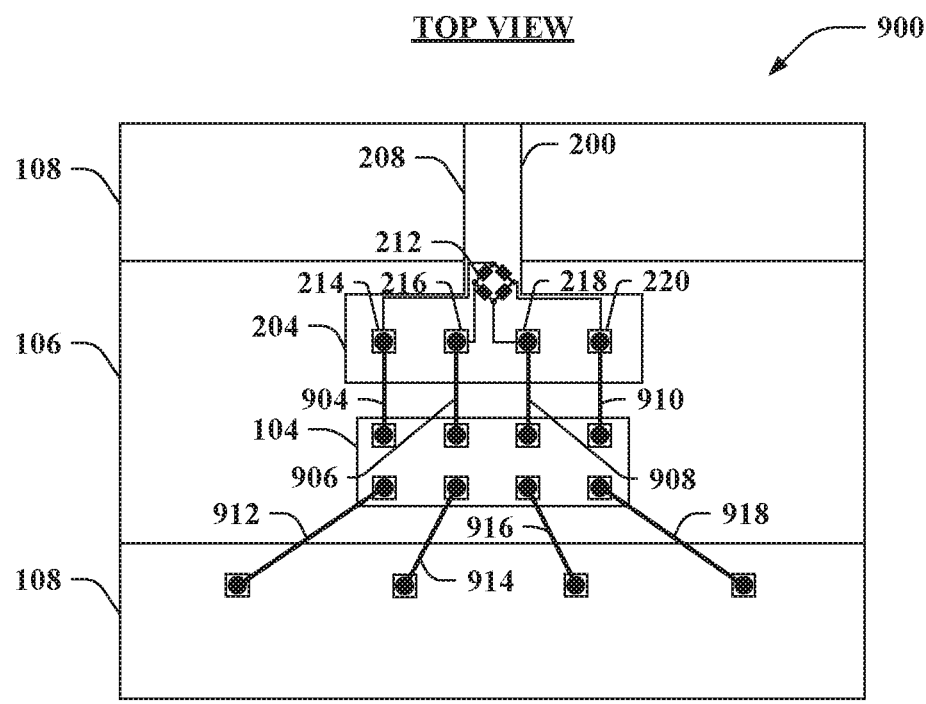
Figure 9:
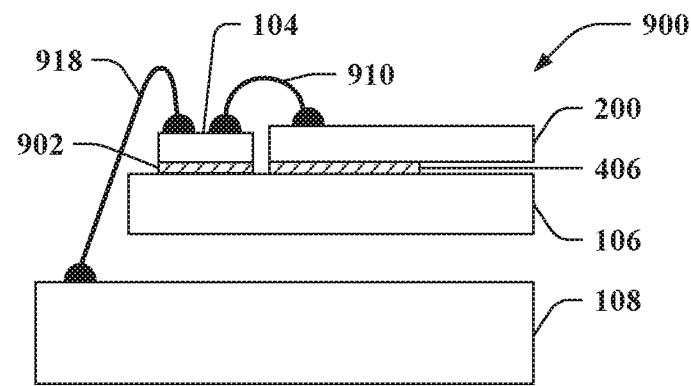

FIGS. 8-9 illustrate yet other exemplary apparatuses (e.g., the apparatus 100) in which the signal processing device 104 is collocated with the micromechanical scanning silicon mirror 200. In the examples shown in FIGS. 8-9, wire bonds are directly between the sensor contacts 214-220 of the micromechanical scanning silicon mirror 200 and the signal processing device 104. Moreover, in the examples depicted in FIGS. 8-9, the signal processing device 104 is physically nearby the piezoresistive sensor 212 without being mounted on the micromechanical scanning silicon mirror 200.

Now turning to FIG. 8, illustrated is an exemplary apparatus 800 (e.g., the apparatus 100). The apparatus 800 includes the micromechanical scanning silicon mirror 200 mounted on the frame 106 (e.g., attached via the layer 406). The apparatus 800 also includes the signal processing device 104 mounted on the printed circuit board 108 (e.g., attached via a layer 802). Again, substantially any type of die stacking technique can be utilized to mount the signal processing device 104 on the printed circuit board 108.

The apparatus 800 further includes wire bonds, namely, a wire bond 804, a wire bond 806, a wire bond 808, and a wire bond 810 (collectively referred to herein as wire bonds 804-810). The wire bonds 804-810 are directly between sensor contacts (e.g., the sensor contacts 214-220) of the micromechanical scanning silicon mirror 200 and the signal processing device 104.

The signal processing device 104 can be mounted on the printed circuit board 108 near the piezoresistive sensor 212 and the sensor contacts 214-220. While the signal path from the piezoresistive sensor 212 to the signal processing device 104 may be longer in the apparatus 800 relative to the signal path from the piezoresistive sensor 212 to the signal processing device 104 in the apparatus 600 or in the apparatus 700, the signal path may be shorter in the apparatus 800 in comparison to conventional approaches, which may include circuit board traces on the printed circuit board 108, etc. Thus, the wire bonds 804-810 directly between the sensor contacts and the signal processing device 104, along with the signal processing device 104 being on the printed circuit board 108 near the piezoresistive sensor 212 and the sensor contacts 214-220, can cause less noise to be introduced to the signal provided by the piezoresistive sensor 212 as compared to conventional approaches.

With reference to FIG. 9, illustrated is another exemplary apparatus 900 (e.g., the apparatus 100) in which the signal processing device 104 is collocated with the micromechanical scanning silicon mirror 200. FIG. 9 shows a top view and a side view of the apparatus 900 (again with only a portion of the micromechanical scanning silicon mirror 200 being shown). The apparatus 900 includes the micromechanical scanning silicon mirror 200 mounted on the frame 106 (e.g., the feet 204-206 are mounted on the frame 106). Similar to above, the micromechanical scanning silicon mirror 200 is attached to the frame 106 via the layer 406.

The apparatus 900 also includes the signal processing device 104. In the example of FIG. 9, the signal processing device 104 is mounted on the frame 106 adjacent to the first foot 204 of the micromechanical scanning silicon mirror 102 (e.g., attached via a layer 902). Similar to above, substantially any type of die stacking technique can be utilized to mount the signal processing device 104 on the frame 106. It is contemplated that the signal processing device 104 and the micromechanical scanning silicon mirror 102 can be positioned at other locations relative to each other on the frame 106, and thus, the claimed subject matter is not limited to the orientation depicted in FIG. 9 (e.g., the signal processing device 104 can be positioned to the left or right of the first foot 204 on the frame 106 as shown in the top view of FIG. 9).

The apparatus 900 can further includes wire bonds, namely, a wire bond 904, a wire bond 906, a wire bond 908, and a wire bond 910 (collectively referred to herein as wire bonds 904-910). The wire bonds 904-910 are directly between the sensor contacts 214-220 of the micromechanical scanning silicon mirror 200 and the signal processing device 104. Moreover, the apparatus 900 can include other wire bonds that are longer than the wire bonds 904-910, namely, a wire bond 912, a wire bond 914, a wire bond 916, and a wire bond 918 (collectively referred to herein as wire bonds 912-918). The wire bonds 904-910 are between the signal processing device 104 and the printed circuit board 108 (e.g., the wire bonds 904-910 can be similar to the wire bonds 612-618).

While many of the examples set forth herein include the linear micromechanical scanning silicon mirror 200, it is contemplated that other types of micromechanical scanning silicon mirrors are intended to fall within the scope of the hereto appended claims. Thus, the micromechanical scanning silicon mirror 200 in one or more of the examples of the apparatus 100 can be replaced by a differing type of micromechanical scanning silicon mirror. For example, a biaxial micromechanical scanning silicon mirror can replace the micromechanical scanning silicon mirror 200 (e.g., the micromechanical scanning silicon mirror 102 can be a biaxial micromechanical scanning silicon mirror).

Figure 10:
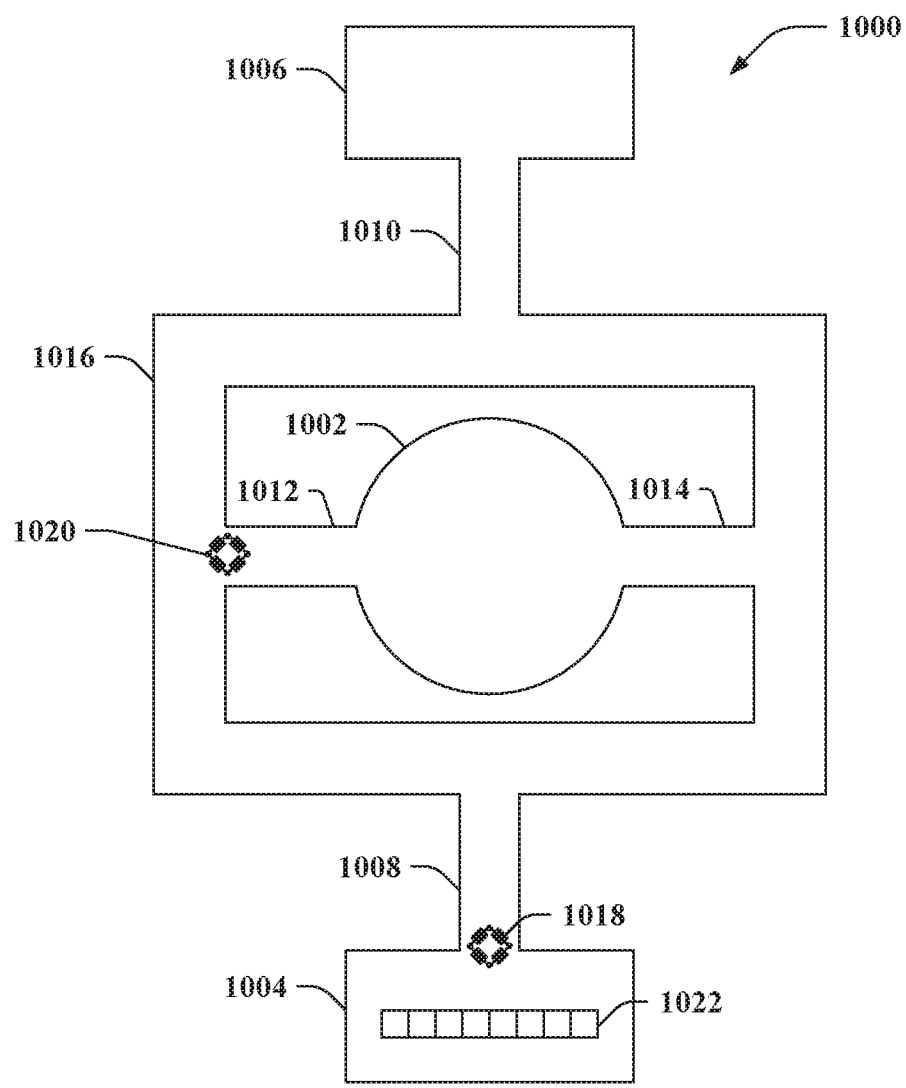
FIG. 10 illustrates an exemplary biaxial scanning silicon mirror.

With reference to FIG. 10, illustrated is an exemplary biaxial scanning silicon mirror 1000 (e.g., the micromechanical scanning silicon mirror 102 of FIG. 1). The micromechanical scanning silicon mirror 1000 can include a mirror section 1002, a first foot 1004, a second foot 1006, a first flexure 1008, second flexure 1010, a third flexure 1012, a fourth flexure 1014, and a deflectable frame 1016. Moreover, the micromechanical scanning silicon mirror 1000 can include a first piezoresistive sensor 1018 and a second piezoresistive sensor 1020 (collectively referred to herein as piezoresistive sensors 1018-1020). The micromechanical scanning silicon mirror 1000 can also include sensor contacts 1022 that are electrically coupled to the piezoresistive sensors 1018-1020 (connections between the piezoresistive sensors 1018-1020 and sensor contacts 1022 are not shown).

The first flexure 1008 is between the mirror section 1002 and the first foot 1004. A distal end of the first flexure 1008 terminates at the first foot 1004. Moreover, the second flexure 1010 is between the mirror section 1002 and the second foot 1006. A distal end of the second flexure 1010 terminates at the second foot 1006. In the embodiment shown in FIG. 10, a proximal end of the first flexure 1008 terminates at the deflectable frame 1016, and a proximal end of the second flexure 1010 terminates at the deflectable frame 1016. Further, a proximal end of the third flexure 1012 can terminate at the mirror section 1002 and a distal end of the third flexure 1012 can terminate at the deflectable frame 1016. A proximal end of the fourth flexure 1014 can terminate at the mirror section 1002 and a distal end of the fourth flexure 1014 can terminate at the deflectable frame 1016. The first piezoresistive sensor 1018 can be located at the distal end of the first flexure 1008. Moreover, the second piezoresistive sensor 1020 can be located at the distal end of the third flexure 1012.

It is to be appreciated that other shapes, orientations, and designs of micromechanical scanning silicon mirrors (including other biaxial micromechanical scanning silicon mirrors) are intended to fall within the scope of the hereto appended claims.

Figure 11:
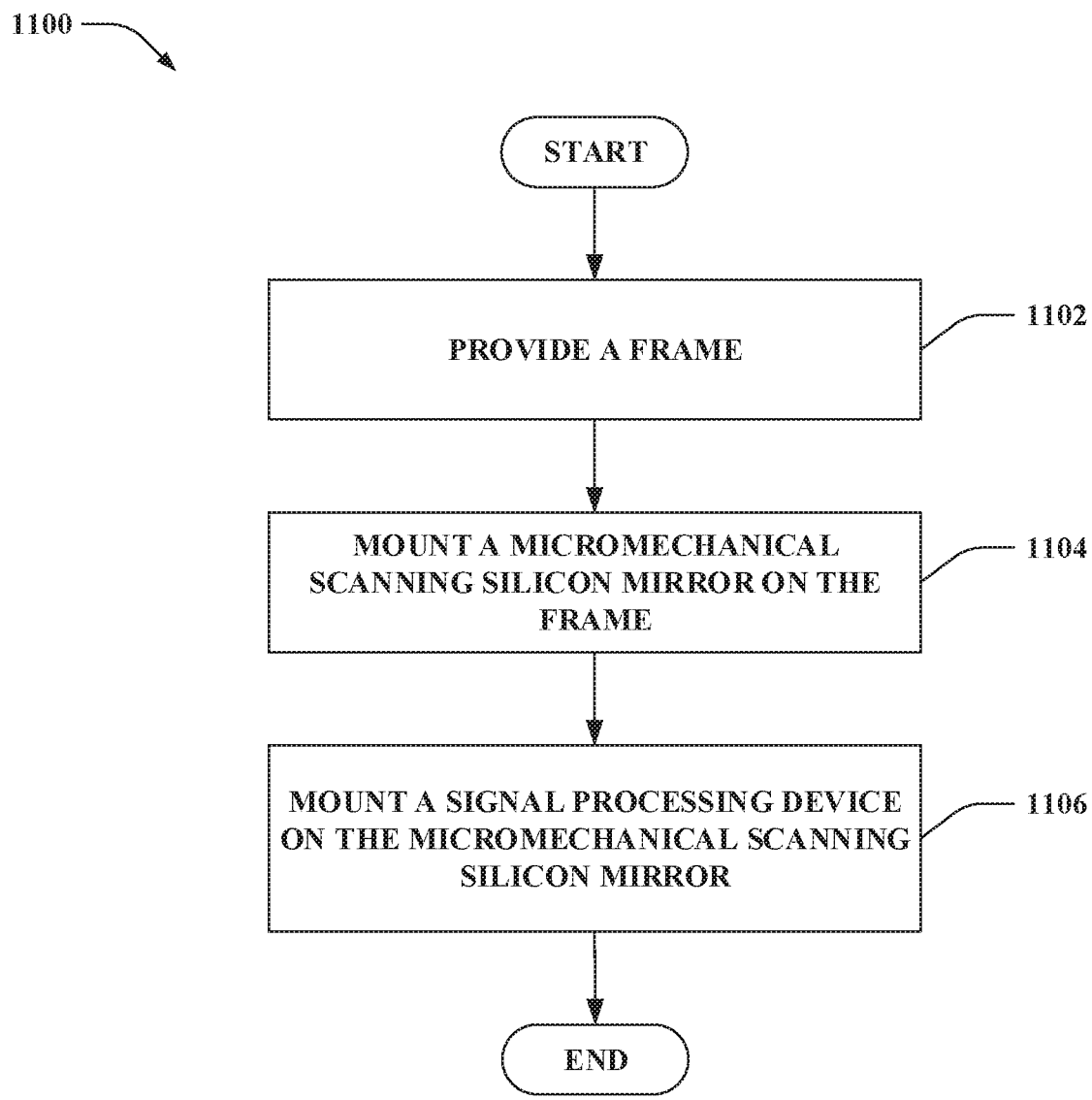
FIG. 11 is a flow diagram that illustrates an exemplary methodology for assembling an apparatus that includes a signal processing device collocated with a micromechanical scanning silicon mirror.
Figure 12:
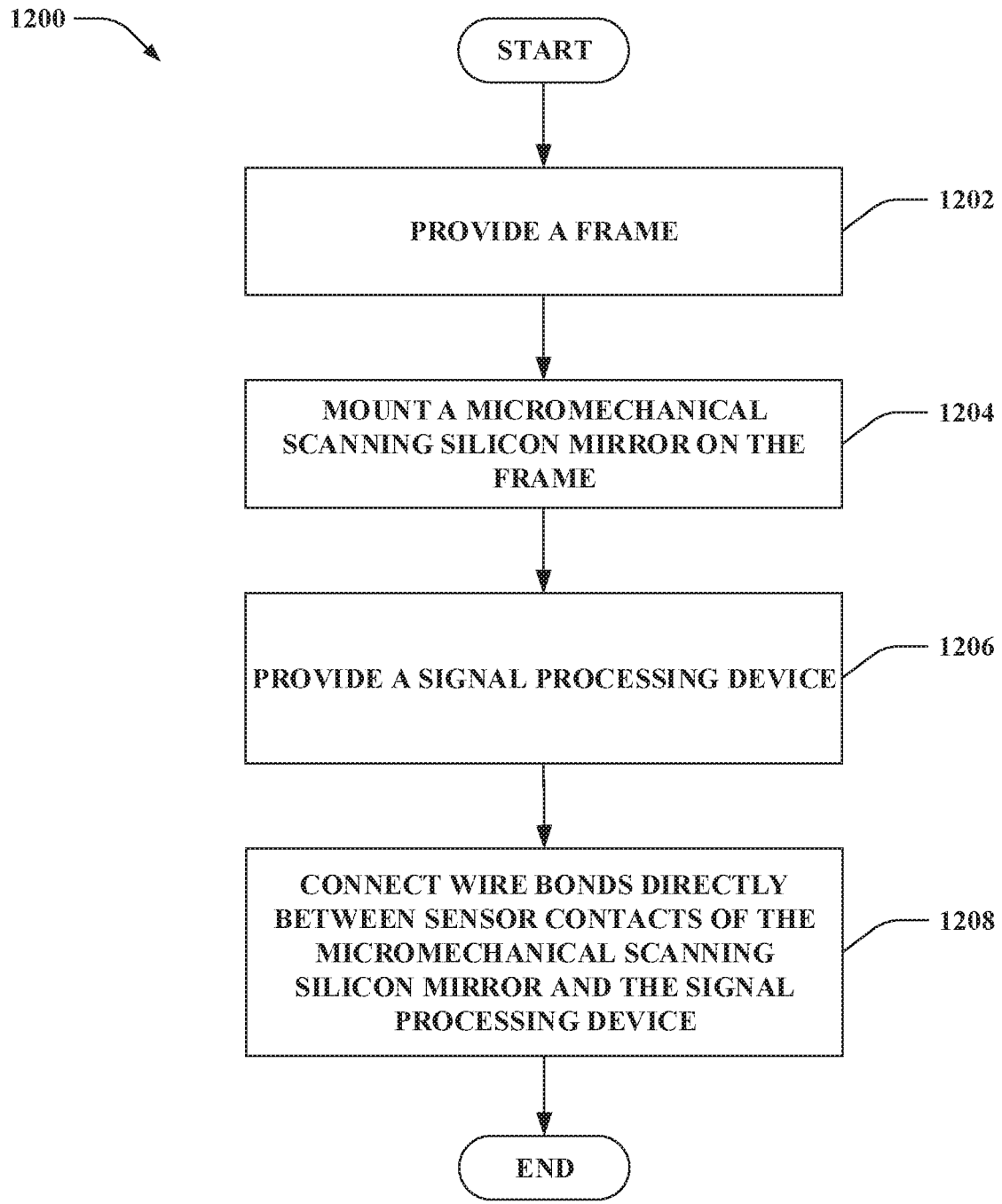
FIG. 12 is a flow diagram that illustrates another exemplary methodology for assembling an apparatus that includes a signal processing device collocated with a micromechanical scanning silicon mirror.

FIGS. 11-12 illustrate exemplary methodologies relating to assembling an apparatus that includes a signal processing device collocated with a micromechanical scanning silicon mirror. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

FIG. 11 illustrates a methodology 1100 for assembling an apparatus that includes a signal processing device collocated with a micromechanical scanning silicon mirror. At 1102, a frame can be provided. At 1104, the micromechanical scanning silicon mirror can be mounted on the frame. For instance, feet of the micromechanical scanning silicon mirror can be mounted on the frame. At 1106, the signal processing device can be mounted on the micromechanical scanning silicon mirror. For instance, the signal processing device can be mounted on one of the feet of the micromechanical scanning silicon mirror.

With reference to FIG. 12, illustrated is another methodology 1200 for assembling an apparatus that includes a signal processing device collocated with a micromechanical scanning silicon mirror. At 1202, a frame can be provided. At 1204, the micromechanical scanning silicon mirror can be mounted on the frame. The micromechanical scanning silicon mirror can include a piezoresistive sensor and sensor contacts, where the sensor contacts are electrically coupled to the piezoresistive sensor. At 1206, the signal processing device is provided. The signal processing device can be mounted on the micromechanical scanning silicon mirror, mounted on the frame, or mounted on a printed circuit board. At 1208, wire bonds can be directly connected between the sensor contacts of the micromechanical scanning silicon mirror and the signal processing device.

Various examples are now set forth.

Example 1

An apparatus, comprising: a micromechanical scanning silicon mirror, comprising: a mirror section; a first foot and a second foot; a first flexure and a second flexure, the first flexure between the mirror section and the first foot, a distal end of the first flexure terminates at the first foot, the second flexure between the mirror section and the second foot, and a distal end of the second flexure terminates at the second foot; a piezoresistive sensor; and sensor contacts, the sensor contacts electrically coupled to the piezoresistive sensor; a signal processing device; and wire bonds, the wire bonds being directly between the sensor contacts of the micromechanical scanning silicon mirror and the signal processing device; wherein the micromechanical scanning silicon mirror and the signal processing device are part of separate dies.

Example 2

The apparatus according to Example 1, the signal processing device is mounted on the first foot of the micromechanical scanning silicon mirror.

Example 3

The apparatus according to Example 2, the signal processing device is mounted on the first foot of the micromechanical scanning silicon mirror using at least one of die attach tape or adhesive.

Example 4

The apparatus according to Example 1, further comprising: a printed circuit board; and a frame, the frame configured to tilt relative to the printed circuit board; wherein the first foot and the second foot of the micromechanical scanning silicon mirror are mounted on the frame; and wherein the signal processing device is mounted on the frame adjacent to the first foot of the micromechanical scanning silicon mirror.

Example 5

The apparatus according to Example 1, further comprising: a printed circuit board; and a frame, the frame configured to tilt relative to the printed circuit board; wherein the first foot and the second foot of the micromechanical scanning silicon mirror are mounted on the frame; and wherein the signal processing device is mounted on the printed circuit board.

Example 6

The apparatus according to any of Examples 1-5, the piezoresistive sensor located at the distal end of the first flexure.

Example 7

The apparatus according to any of Examples 1-6, the first foot of the micromechanical scanning silicon mirror comprises the sensor contacts.

Example 8

The apparatus according to any of Examples 1-7, a proximal end of the first flexure terminates at the mirror section, and a proximal end of the second flexure terminates at the mirror section.

Example 9

The apparatus according to any of Examples 1-8, wherein the signal processing device comprises an amplifier.

Example 10

The apparatus according to any of Examples 1-9, wherein the signal processing device comprises a comparator.

Example 11

The apparatus according to any of Examples 1-10, wherein the signal processing device comprises a buffer.

Example 12

The apparatus according to any of Examples 1-11, wherein the signal processing device comprises an analog to digital converter.

Example 13

The apparatus according to any of Examples 1-12, the micromechanical scanning silicon mirror further comprises: a deflectable frame; a third flexure and a fourth flexure, a proximal end of the third flexure terminates at the mirror section and a distal end of the third flexure terminates at the deflectable frame, and a proximal end of the fourth flexure terminates at the mirror section and a distal end of the fourth flexure terminates at the deflectable frame; and a second piezoresistive sensor located at the distal end of the third flexure; wherein the sensor contacts are further electrically coupled to the second piezoresistive sensor; and wherein a proximal end of the first flexure terminates at the deflectable frame, and a proximal end of the second flexure terminates at the deflectable frame.

Example 14

An apparatus, comprising: a micromechanical scanning silicon mirror, comprising: a mirror section; a first foot and a second foot; a first flexure and a second flexure, the first flexure between the mirror section and the first foot, a distal end of the first flexure terminates at the first foot, the second flexure between the mirror section and the second foot, and a distal end of the second flexure terminates at the second foot; a piezoresistive sensor; and sensor contacts, the sensor contacts electrically coupled to the piezoresistive sensor; and a signal processing device, the signal processing device mounted on the first foot of the micromechanical scanning silicon mirror, and the signal processing device being electrically coupled to the sensor contacts; wherein the micromechanical scanning silicon mirror and the signal processing device are part of separate dies.

Example 15

The apparatus according to Example 14, further comprising: wire bonds, the wire bonds electrically couple the signal processing device and the sensor contacts by being directly connected between the sensor contacts of the micromechanical scanning silicon mirror and the signal processing device.

Example 16

The apparatus according to Example 15, the signal processing device is mounted on the first foot of the micromechanical scanning silicon mirror using at least one of die attach tape or adhesive.

Example 17

The apparatus according to Example 14, the signal processing device is mounted on the first foot of the micromechanical scanning silicon mirror via connectors, wherein the connectors both mechanically and electrically connect the micromechanical scanning silicon mirror and the signal processing device.

Example 18

The apparatus according to Example 17, the connectors comprise at least one of solder bumps, gold stud bumps, or copper pillars.

Example 19

The apparatus according to any of Examples 14-18, further comprising: a printed circuit board; and a frame, the frame configured to tilt relative to the printed circuit board; wherein the first foot and the second foot of the micromechanical scanning silicon mirror are mounted on the frame.

Example 20

A method of constructing an apparatus, comprising: providing a frame, the frame configured to tilt relative to a printed circuit board; mounting a micromechanical scanning silicon mirror on the frame; and mounting a signal processing device on the micromechanical scanning silicon mirror, wherein the micromechanical scanning silicon mirror and the signal processing device are part of separate dies.

Further, as used herein, the term "exemplary" is intended to mean "serving as an illustration or example of something."

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. An apparatus, comprising:
   a micromechanical scanning silicon mirror, comprising:
      a mirror section;
      a first foot and a second foot;
      a first flexure and a second flexure, the first flexure between the mirror section and the first foot, a distal end of the first flexure terminates at the first foot, the second flexure between the mirror section and the second foot, and a distal end of the second flexure terminates at the second foot;
      a piezoresistive sensor configured to output a signal; and
      sensor contacts, the sensor contacts electrically coupled to the piezoresistive sensor;
   a signal processing device configured to receive the signal outputted by the piezoresistive sensor; and
   wire bonds, the wire bonds directly connect the sensor contacts of the micromechanical scanning silicon mirror to the signal processing device as part of a signal path between the piezoresistive sensor and the signal processing device;
   wherein the micromechanical scanning silicon mirror and the signal processing device are part of separate dies.

2. The apparatus of claim 1, the signal processing device is mounted on the first foot of the micromechanical scanning silicon mirror.

3. The apparatus of claim 2, the signal processing device is mounted on the first foot of the micromechanical scanning silicon mirror using at least one of die attach tape or adhesive.

4. The apparatus of claim 1, further comprising:
   a printed circuit board; and
   a frame, the frame configured to tilt relative to the printed circuit board;
   wherein the first foot and the second foot of the micromechanical scanning silicon mirror are mounted on the frame; and
   wherein the signal processing device is mounted on the frame adjacent to the first foot of the micromechanical scanning silicon mirror.

5. The apparatus of claim 1, further comprising:
   a printed circuit board; and
   a frame, the frame configured to tilt relative to the printed circuit board;
   wherein the first foot and the second foot of the micromechanical scanning silicon mirror are mounted on the frame; and
   wherein the signal processing device is mounted on the printed circuit board.

6. The apparatus of claim 1, the piezoresistive sensor located at the distal end of the first flexure.

7. The apparatus of claim 1, the first foot of the micromechanical scanning silicon mirror comprises the sensor contacts.

8. The apparatus of claim 1, a proximal end of the first flexure terminates at the mirror section, and a proximal end of the second flexure terminates at the mirror section.

9. The apparatus of claim 1, wherein the signal processing device comprises an amplifier.

10. The apparatus of claim 1, wherein the signal processing device comprises a comparator.

11. The apparatus of claim 1, wherein the signal processing device comprises a buffer.

12. The apparatus of claim 1, wherein the signal processing device comprises an analog to digital converter.

13. The apparatus of claim 1, the micromechanical scanning silicon mirror further comprises:
    a deflectable frame;
    a third flexure and a fourth flexure, a proximal end of the third flexure terminates at the mirror section and a distal end of the third flexure terminates at the deflectable frame, and a proximal end of the fourth flexure terminates at the mirror section and a distal end of the fourth flexure terminates at the deflectable frame; and
    a second piezoresistive sensor located at the distal end of the third flexure;
    wherein the sensor contacts are further electrically coupled to the second piezoresistive sensor; and
    wherein a proximal end of the first flexure terminates at the deflectable frame, and a proximal end of the second flexure terminates at the deflectable frame.

14. An apparatus, comprising:
    a micromechanical scanning silicon mirror, comprising:
       a mirror section;
       a first foot and a second foot;
       a first flexure and a second flexure, the first flexure between the mirror section and the first foot, a distal end of the first flexure terminates at the first foot, the second flexure between the mirror section and the second foot, and a distal end of the second flexure terminates at the second foot;
       a piezoresistive sensor configured to output a signal; and
       sensor contacts, the sensor contacts electrically coupled to the piezoresistive sensor; and
    a signal processing device configured to receive the signal outputted by the piezoresistive sensor, the signal processing device mounted on the first foot of the micromechanical scanning silicon mirror, and the signal processing device being electrically coupled to the sensor contacts;
    wherein the micromechanical scanning silicon mirror and the signal processing device are part of separate dies.

15. The apparatus of claim 14, further comprising:
    wire bonds, the wire bonds electrically couple the signal processing device and the sensor contacts by directly connecting the sensor contacts of the micromechanical scanning silicon mirror to the signal processing device as part of a signal path between the piezoresistive sensor and the signal processing device.

16. The apparatus of claim 15, the signal processing device is mounted on the first foot of the micromechanical scanning silicon mirror using at least one of die attach tape or adhesive.

17. The apparatus of claim 14, the signal processing device is mounted on the first foot of the micromechanical scanning silicon mirror via connectors, wherein the connectors both mechanically and electrically connect the micromechanical scanning silicon mirror and the signal processing device.

18. The apparatus of claim 17, the connectors comprise at least one of solder bumps, gold stud bumps, or copper pillars.

19. The apparatus of claim 14, further comprising:
a printed circuit board; and
a frame, the frame configured to tilt relative to the printed circuit board;
wherein the first foot and the second foot of the micromechanical scanning silicon mirror are mounted on the frame.

20. A method of constructing an apparatus, comprising:
providing a frame, the frame configured to tilt relative to a printed circuit board;
mounting a micromechanical scanning silicon mirror on the frame, wherein the micromechanical scanning silicon mirror comprises a piezoresistive sensor;
mounting a signal processing device on the micromechanical scanning silicon mirror, wherein the micromechanical scanning silicon mirror and the signal processing device are part of separate dies, and
electrically coupling the piezoresistive sensor and the signal processing device such that a signal outputted by the piezoresistive sensor is received by the signal processing device.

* * * * *